(12) United States Patent
Watanabe et al.

(10) Patent No.: US 7,893,757 B2
(45) Date of Patent: Feb. 22, 2011

(54) MULTI-CHIP PACKAGE SEMICONDUCTOR DEVICE

(75) Inventors: Tomofumi Watanabe, Gifu (JP); Satoshi Noro, Gifu (JP); Satoshi Yokoo, Ota (JP)

(73) Assignees: Sanyo Electric Co., Ltd. (JP); Sanyo Semiconductor Co., Ltd. (JP)

( * ) Notice: Subject to any disclaimer, the term of this patent is extended or adjusted under 35 U.S.C. 154(b) by 0 days.

(21) Appl. No.: 11/945,030

(22) Filed: Nov. 26, 2007

(65) Prior Publication Data
US 2009/0128229 A1    May 21, 2009

(30) Foreign Application Priority Data
Nov. 20, 2007    (JP)    ............................. 2007-300144

(51) Int. Cl.
    *H01L 25/00*    (2006.01)
(52) U.S. Cl. .................................................... 327/565
(58) Field of Classification Search ................... 327/565
    See application file for complete search history.

(56) References Cited

U.S. PATENT DOCUMENTS 5,077,598 A * 12/1991 Bartelink .................... 257/723
6,184,855 B1 * 2/2001 Kobayashi et al. .......... 345/100
6,734,901 B1    5/2004 Kudo et al.
6,859,917 B2 * 2/2005 Shimazaki et al. ............ 716/17
7,408,330 B2 * 8/2008 Zhao ........................... 323/266
2004/0257150 A1 * 12/2004 Farooqui ...................... 327/539
2006/0227221 A1 * 10/2006 Okubo ....................... 348/208.2

FOREIGN PATENT DOCUMENTS

| JP | 7-23277 | 1/1995 |
| JP | 11-187308 | 7/1999 |
| JP | 2000-101021 A | 4/2000 |
| JP | 2002-57270 | 2/2002 |

OTHER PUBLICATIONS

Chinese Office Action for Application No. 200810178113.5 with English translation issued on Apr. 14, 2010.

* cited by examiner

*Primary Examiner*—Lincoln Donovan
*Assistant Examiner*—Daniel Rojas
(74) *Attorney, Agent, or Firm*—Cantor Colburn LLP

(57) ABSTRACT

An efficient logic chip operating power supply having digital circuits in a multi-chip package is provided. A multi-chip package semiconductor device fabricated in common with a driver chip having analog circuits and a logic chip having digital circuits, a logic chip power supply circuit is provided in which a driver chip creates a logic chip power supply dedicated for the logic chip. The logic chip has internal logic circuitry operating by receiving a power supply from the logic chip power supply circuit via power input terminals.

10 Claims, 3 Drawing Sheets

MULTI-CHIP PACKAGE SEMICONDUCTOR DEVICE

CROSS-REFERENCE TO RELATED APPLICATIONS

The entire disclosure of Japanese Patent Application No. 2007-300144 including specification, claims, drawings, and abstract is incorporated herein by reference.

BACKGROUND OF THE INVENTION

1. Field of the Invention

The present invention relates to an operating power supply of a logic chip having a digital circuit installed in a multi-chip package semiconductor device.

2. Description of the Related Art

A digital circuit for logical processing of digital data can be voltage driven, generally at low power consumption. However, it is difficult to implement a power supply circuit within the digital circuit so as to provide sufficient current driving capability for driving the digital circuit.

For this reason, in the case of a logic chip on which digital circuits are integrated, the power required for the logic chip is often created and supplied by a power supply circuit using bipolar transistors fabricated on a separate chip.

For example, Japanese Patent Laid-Open Publication No. 2002-57270 discloses a semiconductor device having multiple chips of different types of power supply circuits where the respective power supply for each chip is received from a power supply circuit (not shown).

SUMMARY OF THE INVENTION

However, the power supply circuits respectively generate various types of power supply voltages so as to correspond to the multiple chips within the equipment. Thus, for each change and addition of a power supply voltage required in an individual chip, it becomes necessary to employ and add a new power supply circuit with a modified design.

For example, even though the operating power supply voltage at the logic chip is lowered from the viewpoint of reducing power consumption in a logic chip, if the power supply circuit does not correspond to the operating power supply voltage, it is necessary to form a DC/DC converter or the like within the power supply circuit. As a result, it becomes necessary to provide external power supply circuits corresponding to the types of power supply voltages thereby preventing the miniaturization of the equipment.

It is therefore an object of the present invention to provide a multi-chip package semiconductor device comprising a driver chip having analog circuits and a logic chip having digital circuits, wherein the driver chip and the logic chip are within the same package, and wherein the driver chip comprises a logic chip power supply circuit structured to create a logic chip power supply dedicated for the logic chip and a logic chip power supply output terminal structured to output the logic chip power supply, wherein the logic chip comprises a circuit operating by receiving power supply from the logic chip power supply circuit via power supply input terminal.

According to another aspect of the present invention, the driver chip in the semiconductor device is an analog circuit, a part thereof using at least a bipolar device, having a vibration detection analog circuit and a vibration correction analog circuit for anti-shake control in equipment in which the semiconductor device is installed, the logic chip has a digital circuit for creating a correction signal by obtaining a vibration amount on the basis of a vibration detection signal supplied from the driver chip, and the created correction signal is supplied to the vibration correction analog circuit of the driver chip.

According to another aspect of the present invention, in the above-mentioned semiconductor device, the logic chip power supply circuit of the driver chip is a power supply circuit utilizing a band gap constant voltage.

In the present invention, the power supply for use by the logic chip packaged within the multi-chip package is created in the driver chip with analog circuits packaged within the same package. Since the driver chip having analog circuits is equipped with bipolar devices, a band gap constant voltage circuit, for example, can be configured to utilize such bipolar devices to achieve not only sufficient voltage supply performance but also a stable power supply circuit providing sufficient current supply performance, which is difficult in chips for digital circuits.

Furthermore, since such a power supply circuit is built into a driver chip packaged in common within the multi-chip package, a power supply circuit chip dedicated for logic chips is not necessary within the package and inter-chip wiring at the shortest lengths is easy. This therefore contributes to smaller multi-chip package areas and lower costs.

DETAILED DESCRIPTION OF THE PREFERRED EMBODIMENTS

The embodiment of the present invention will be described hereinafter with reference to the attached drawings.

Figure 1:
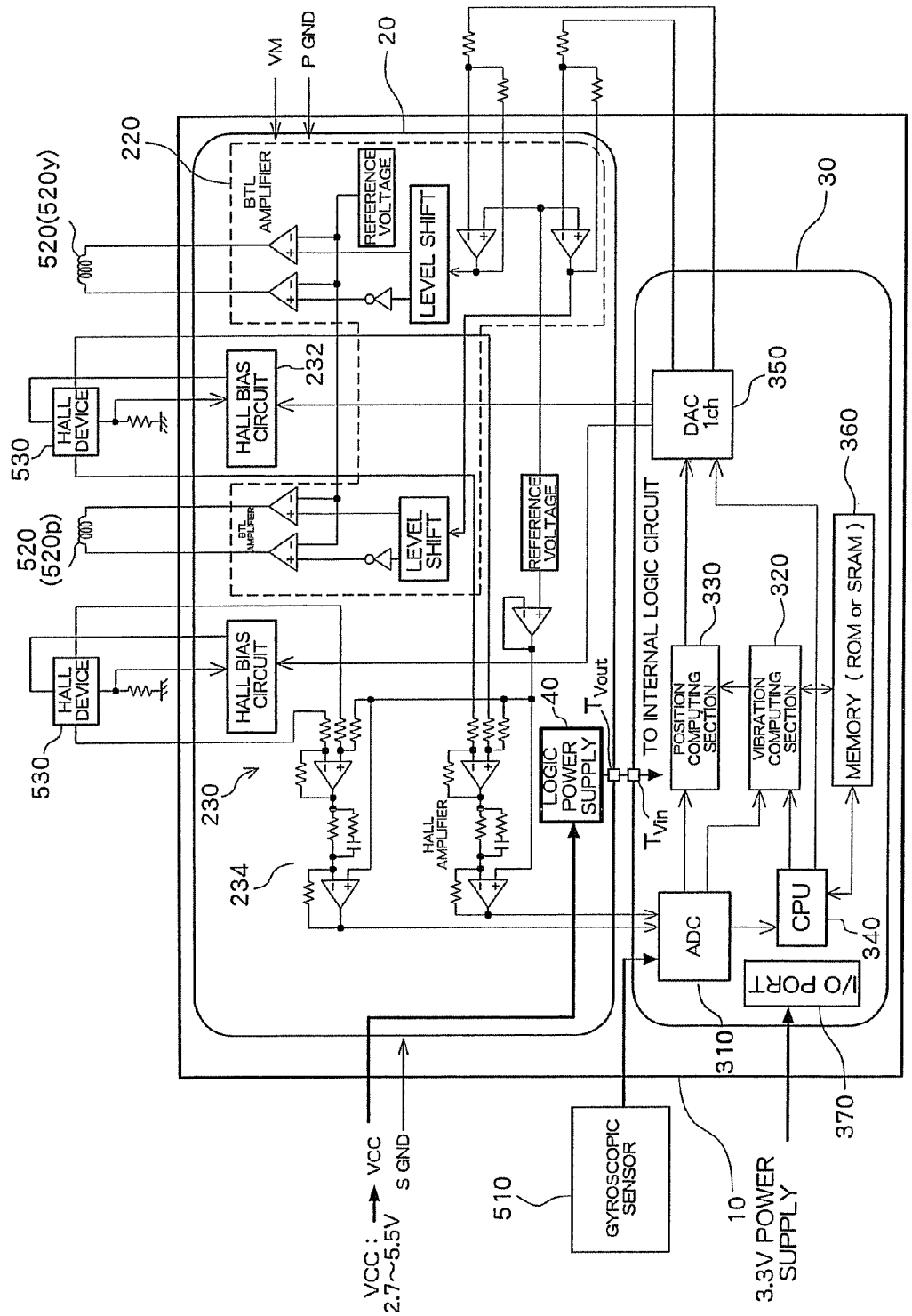
FIG. 1 shows a circuit block diagram of a multi-chip package relating to an embodiment of the present invention.

FIG. 1 shows a circuit block diagram of a multi-chip package (MCP) semiconductor device relating to the embodiment. The semiconductor device 10 is packaged by installing a driver chip 20 having analog circuits and a logic chip 30 having digital circuits on a common substrate. In the embodiment, the semiconductor device can execute a process for implementing an anti-shake function, such as for use in cameras, namely, image stabilization. Although the MCP of the present invention is not limited to semiconductor devices for anti-shake devices, the embodiment will exemplify a semiconductor device for an anti-shake device.

The anti-shake function is provided in image pickup equipment, such as video cameras and digital still cameras, due to the demands of preventing poor images caused by blurring of a subject image occurring from vibrations, typically due to hand vibrations. The anti-shake function can be implemented by a method for detecting vibration of the image pickup equipment with respect to the subject, and in accordance with the vibration, correcting by shifting an optical system (lens) or an imaging device, such as a CCD, by a motor, or by a method for correcting image data.

Since there is a necessity for handling analog signals, vibration detection utilizing such as a gyroscopic sensor and mechanical correction based on a correction signal determined from the detected vibration are executed by the driver chip 20 having analog circuits, partly using at least a bipolar transistor. On the other hand, to obtain the correction signal on the basis of the detected vibration, it is preferable to perform logic operations on the detection signal as a digital signal, and such a correction data process is executed by the logic chip 30 having digital circuits.

In the example shown in FIG. 1, a gyroscopic sensor 510 attached externally to the MCP 10 detects the vibration and amplifies a detected signal. The amplified signal is supplied to the logic chip 30 as a vibration detection signal for use in computation of a correction amount.

A correction analog circuit 220 of the driver chip 20 is supplied with a correction signal obtained by the logic chip 30 in accordance with the vibration. In the example of FIG. 1, voice coil motors (VCM) 520 attached externally to the MCP 10 are used in vibration correction and the correction is performed by adjusting the lens position so as to cancel any shift due to vibration of the imaging device with respect to the subject. VCMs 520 (520p, 520y) are provided in the pitch and yaw directions, and are capable of respectively shifting the lens position in the pitch and yaw directions. The correction analog circuit 220 has a circuit for performing BTL (Bridged Transless) drive of the coils of the VCMs 520. More specifically, the correction signals are shifted to predetermined levels, then amplified by BTL amplifiers, and supplied to the VCM coils to drive the VCMs 520.

The lens position is detected by driving Hall devices 530 attached externally to the MCP 10 and Hall device analog circuits of the driver chip 20 have bias circuits 232 for applying a bias voltage to the Hall devices 530 and Hall amplifiers 234 for creating position detection signals by amplifying signals obtained from the Hall devices 530. The position detection signals are supplied to the logic chip 30 and used for lens drive feedback by the above-mentioned VCMs 520.

The logic chip 30 is equipped with an analog/digital conversion circuit (ADC) 310 for converting analog signals, such as the vibration detection signals obtained from the gyroscopic sensor 510 and the position detection signals obtained from the Hall amplifiers 234, to digital signals. Further included are a vibration computing section 320 for obtaining a vibration amount from the vibration detection signals, a position computing section 330 for determining a position control signal for correction from the position detection signals and the vibration amount, and a processing section (CPU) 340 for controlling operations, such as of the vibration computing section 320 and the position computing section 330. Also included is a digital/analog conversion circuit (DAC) 350 where the obtained position control signal is converted to an analog signal and then supplied to the driver chip 20. Moreover, a memory section 360, such as ROM or SRAM for storing data necessary for computation, and an external input/output terminal circuit (I/O port) 370 are also integrated in the chip.

In the logic chip 30, the I/O port 370 operates by receiving a 3.3 V power supply from an external device power supply circuit. However, the internal logic circuit (vibration computing section 320, position computing section 330, CPU 340, and so forth) in this embodiment employs low voltage circuits, which operate by receiving a 1.2 V power supply.

Since the logic chip 30 is a digital circuit using CMOS transistors, to obtain the 1.2 V power supply from the 3.3 V power supply, which is supplied from the external power supply, not only is a voltage step-down circuit having a large area required but a power supply circuit having sufficient current supplying performance cannot be fabricated only with CMOS transistors. In the embodiment, the power supply (1.2 V power supply) used in the logic chip 30 is fabricated within the above-mentioned driver chip 20 and packaged together with the logic chip 30 without using a dedicated power supply circuit chip.

As described hereinabove, the driver chip 20 uses analog circuits 220, 230 equipped with bipolar transistors for vibration correction, and the Hall devices. Therefore, a stable power supply circuit, such as one utilizing a band gap constant voltage circuit, can be integrated on the same semiconductor substrate during formation of these analog circuits.

Figure 2:
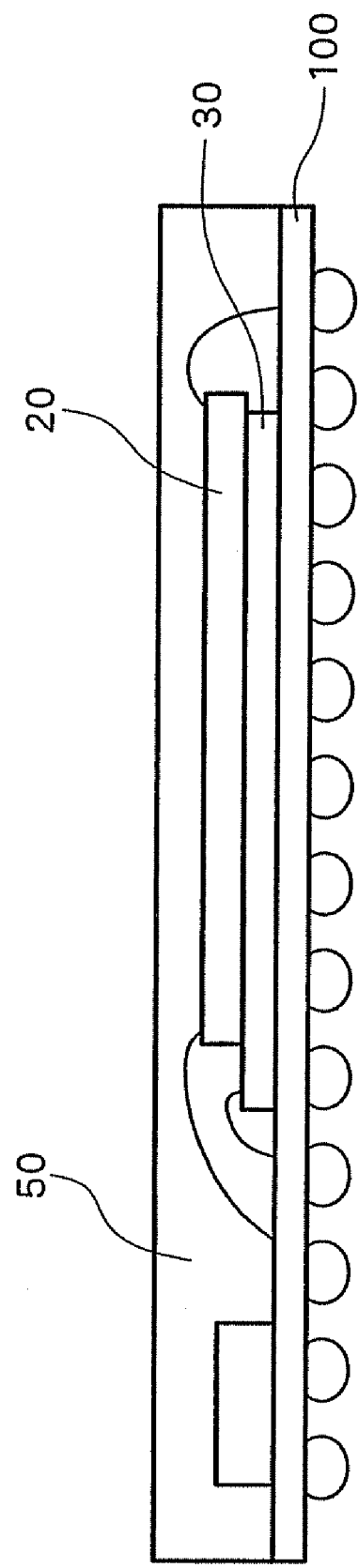
FIG. 2 illustrates a multi-chip package 10.

Furthermore, as shown in FIG. 2, the driver chip 20 and the logic chip 30 are packaged with a mold material 50, such as resin, on a package substrate 100 in common within a single package. In the example of FIG. 2, these two chips are stacked with the driver chip 20 on the logic chip 30 and packaged on the substrate 100 on which the mold material 50 is distributed so as to cover the entirety. The chips are not limited to the stacking method and may be arranged in multiple in the horizontal direction. Furthermore, although the substrate 100 may employ a core substrate, a packaging method where the chips are installed directly on a wiring pattern film can be employed for a denser and thinner package. Moreover, the number of chips to be packaged is not intended to be limited to two and other chips may also be packaged together as necessary. In this manner, in the MCP 10, different chips are packaged into a single package so that the distance between terminals can be made extremely short and the 1.2 V power supply can be supplied from the driver chip 20 to the logic chip 30 at a low power loss. The driver chip 20 employs an bi-CMOS chip equipped with both bipolar transistors and MOS transistors.

In the embodiment, the logic power supply circuit 40 dedicated for the logic chip and unused by the driver chip 20 is provided in the driver chip 20. The logic power supply circuit 40 creates a power supply voltage (1.2 V), which is different from Vcc and necessary for the logic chip 30, on the basis of the Vcc (2.7 V to 5.5 V) supplied from a power supply device (not shown).

Figure 3:
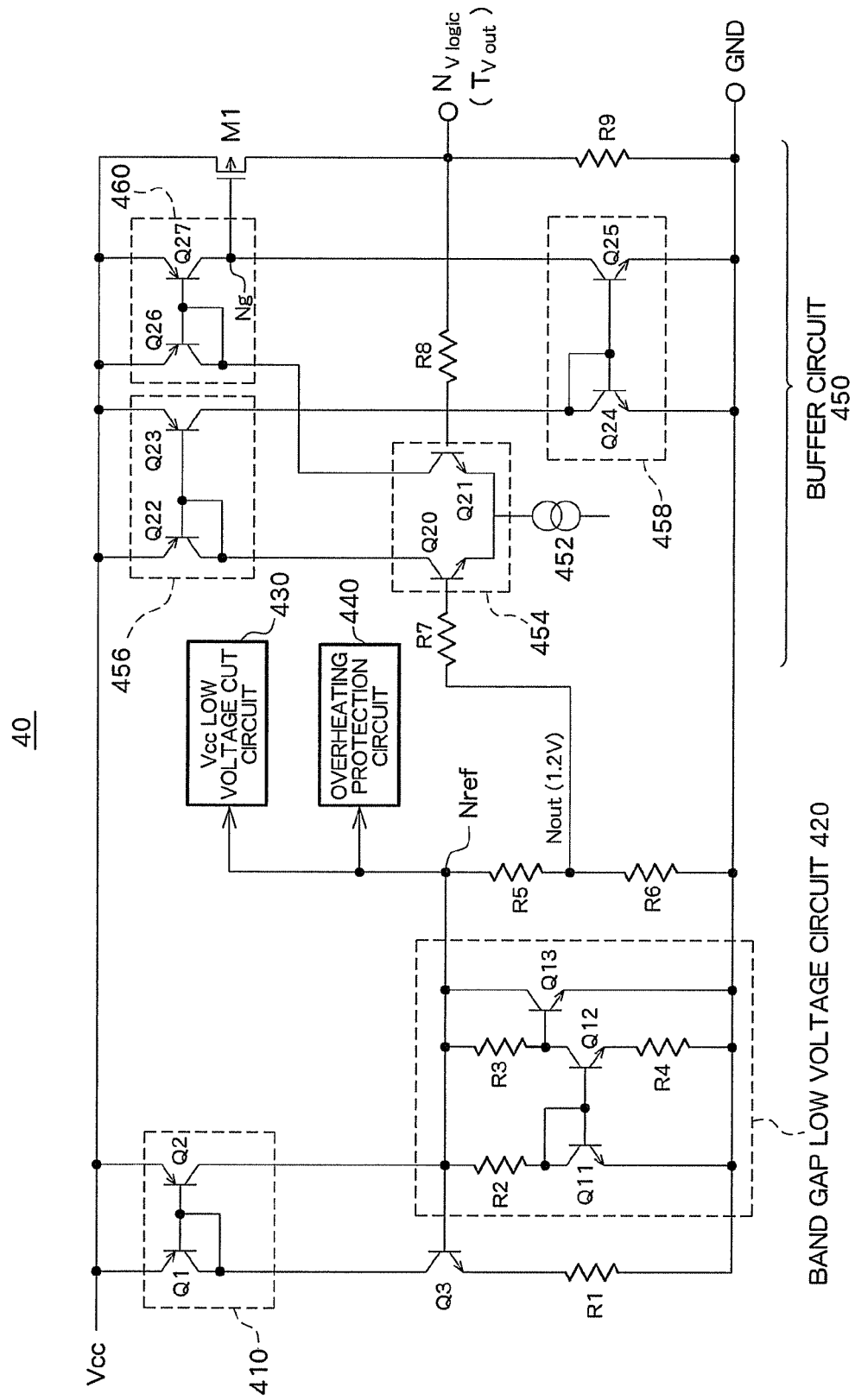
FIG. 3 shows an example circuit configuration of a logic power supply circuit 40.

FIG. 3 shows an example of a block diagram of the 1.2 V power supply circuit (logic chip power supply circuit) 40 formed within the driver chip 20.

To the driver chip 20 is supplied Vcc (around 2.7 V to 5.5 V depending on demand) as an operating power supply for the driver chip 20 from an external device power supply circuit. The logic chip power supply circuit 40 of FIG. 3 is basically equipped with a band gap circuit 420 and a buffer circuit 450. The band gap constant voltage circuit 420 has NPN transistors Q11, Q12, Q13 and resistors R2, R3, R4.

The base and collector of the transistor Q11 are connected and the collector of Q11 is connected to a node Nref via the resistor R2. Furthermore, the emitter of Q11 is connected to GND. The base of Q11 is connected to the base of the transistor Q12 having an emitter area of several integral times that of Q11. The emitter of Q12 is connected to GND via the resistor R4 and the collector of Q12 is connected to the node Nref via the resistor R3.

The connection point of the collector of Q12 and the resistor R3 is connected to the base of the transistor Q13, the emitter of Q13 is connected to GND, and the collector is connected to Nref.

A constant current supply 410 is provided between the band gap constant voltage circuit 420 and the power supply Vcc and supplies a constant current to the band gap constant voltage circuit 420. The collector and emitter of an NPN transistor Q3 and a resistor R1 for adjusting the current amount in the constant current supply 410 are provided between the constant current supply 410 and GND.

An emitter area Ae2 of Q12 is set to be an integral number of times N of an emitter area Ae1 of Q11 and the bases of both transistors are connected in common. For this reason, a voltage difference $\Delta Vbe$ between Vbe1, which is the voltage between the base and emitter of Q11, and Vbe2, which is the voltage between the base and emitter of Q12, is equivalent to the voltage created at the resistor R4 and can be expressed by the following expression (1).

$$\Delta Vbe = Vbe1 - Vbe2 \quad (1)$$
$$= (kT/q) * \ln[(Ie1/Ae1)/(Ie2/Ae2)]$$
$$= (kT/q) * \ln[(Ie1/Ie2)N]$$

In expression (1), k is the Boltzmann constant, T is the absolute temperature, q is the amount of electron charge, Ie1 is the emitter current of Q11, and Ie2 is the emitter current of the Q12.

The emitter current Ie2 of Q12 is expressed by the following expression (2), where R4 is the resistance value of the resistor R4.

$$Ie2 = \Delta Vbe/R4 \quad (2)$$

Furthermore, a voltage VR3 generated across the ends of the resistor R3 is expressed by the following expression (3), where Ic2 is the collector current of Q12 and Ib3 is the base current of Q13.

$$VR3 = Ic2*R3 + Ib3*R3 \quad (3)$$

When the current amplification factor $h_{FE}$ of the transistor to be used is sufficiently large and the base current can be ignored, the above expression (3) can be expressed as the following expression (4).

$$VR3 = Ie2*R3 = (R3/R4)*\Delta Vbe \quad (4)$$

Thus, the voltage Vref at node Nref is determined by the following expression (5).

$$Vref = Vbe3 + (R3/R4)*\Delta Vbe \quad (5)$$
$$= Vbe3 + (R3/R4)*(kt/q)*\ln[(Ie1/Ie2)N]$$

When the resistance values of the resistor R2 and R3 are equal, the collector currents of Q11 and Q12 are equal, and when the current amplification factor $h_{FE}$ of both transistors is sufficiently large and their base currents can be ignored, the emitter currents of Q11 and Q12 are equal so that expression (5) is expressed by the following expression (6).

$$Vref = Vbe3 + (R3/R4)*(kT/q)*\ln[N] \quad (6)$$

As described hereinabove, the voltage Vref at node Nref is created in the band gap constant voltage circuit 420.

Resistors R5 and R6 for a voltage divider are connected in sequence between the node Nref and GND. The resistance values of the resistors R5 and R6 are set so that the connection point between the resistor R5 and the resistor R6 becomes the logic chip power supply voltage of 1.2 V, which is the object in the embodiment.

An output node Nout, which is the connection point between the resistors R5 and R6, is connected to the buffer circuit 450 where the current amount is adjusted.

As an example, the buffer circuit 450 is provided with a comparator 454 as shown in FIG. 3. The comparator 454 is provided with an NPN transistor Q20 having a base connected via a resistor R7 to the output node Nout and an NPN transistor Q21 having a base connected via a resistor R8 to the power supply output node $N_{Vlogic}$. The emitters of the transistors Q20 and Q21 are connected to a constant current supply 452, and the collector of the transistor Q20 is connected to a PNP transistor Q22 of a first current mirror circuit (hereinafter referred to as first mirror circuit) 456, provided between the transistor Q20 and Vcc, and receives a current supply. Furthermore, the collector of the transistor Q21 is also connected to a PNP transistor Q26 of a second current mirror circuit (hereinafter referred to as second mirror circuit) 460, provided between the transistor Q21 and Vcc, and receives a current supply.

The collector of a PNP transistor Q23 on the output side of the above-mentioned current mirror circuit 456 is connected to the base and collector of an NPN transistor Q24 of a third current mirror circuit (hereinafter referred to as third mirror circuit) 458 provided between the collector of the PNP transistor Q23 and GND. A current equivalent to the current flowing from Q22 of the first mirror circuit 456 to Q20 of the comparator 454 flows to Q23 and this current is supplied to Q24 of the third mirror circuit 458. An NPN transistor Q25 on the output side of the third mirror circuit 458 is connected to a connection node Ng of the collector of a PNP transistor Q27 of the second mirror circuit and the gate of a PMOS transistor M1 and a current equivalent to the current of Q24 flows from Q25 toward GND.

On the other hand, a current equivalent to the current flowing from Q26 (current supplied to Q21 of the comparator 454) having a base connected in common with that of the PNP transistor Q27 flows from Vcc through Q27 on the output side of the second mirror circuit toward the connection node Ng.

The above-mentioned M1, the gate of which is connected to the connection node Ng, has either its source or drain terminal connected to Vcc and the other terminal connected to the power supply output node $N_{Vlogic}$. Furthermore, a resistor R9 is connected between the power supply output node $N_{Vlogic}$ and GND.

The voltage at the connection node Ng is adjusted by the current supplied from the second mirror circuit 460 and the current extracted by the third mirror circuit 458. The PMOS transistor M1 operates in accordance with the voltage at the connection node Ng and the current supplied from Vcc to the power supply output node $N_{Vlogic}$ is adjusted and the voltage at the power supply output node $N_{Vlogic}$ is adjusted to match the voltage at the output node $N_{out}$ from the band gap constant voltage circuit 420.

The power supply output node $N_{Vlogic}$ corresponds to the logic power supply output terminal ($T_{Vout}$) of the driver chip 20 and the created logic power supply is supplied to the logic input terminal $T_{Vin}$ of the logic chip 30 provided within the same package as shown in FIG. 1 and FIG. 2.

To the node Nref is connected a Vcc low-voltage cut circuit 430. When the Vcc voltage decreases below a predetermined voltage, such as at the activation of Vcc or a Vcc drop due to battery discharge, the transistor M1 is turned off to prevent the output voltage $T_{Vout}$ from decreasing. Furthermore, to node Nref is also connected an overheat protection circuit 440, which protects the power supply circuit during overheating of the band gap constant voltage circuit 420 by stopping the operation of the transistor M1, which is a heat generating source. In the example of FIG. 3, the Vcc low-voltage cut circuit 430 and the overheat protection circuit 440 control the gate (Ng) voltage of the transistor M1 through a current control line. This stops the operation of M1 to protect the power supply circuit as well as the circuits receiving this power supply and to stabilize the output voltage. Furthermore, when a power supply circuit is provided using a band gap constant voltage circuit for the driver chip within the driver chip 20, the power supply circuits for driver chips may also be protected by using the same above-mentioned Vcc low-voltage cut circuit 430 and the overheat protection circuit 440.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A multi-chip package semiconductor device comprising:
    a driver chip having analog circuits; and
    a logic chip having digital circuits;
    wherein the driver chip and the logic chip are provided within the same package; and
    wherein the driver chip comprises:
        a motor drive circuit for driving a motor in accordance with a signal obtained by the logic chip;
        a logic chip power supply circuit structured to create a logic chip power supply dedicated for said logic chip;
        and a logic chip power supply output terminal structured to output said logic chip power supply; and
    wherein the logic chip comprises a circuit operating by receiving power supply from said logic chip power supply circuit via power supply input terminal;
    the motor drive circuit, the logic power supply circuit and the logic power supply output terminal are integrated on a same semiconductor substrate of the driver chip; and
    the digital circuits are integrated on a semiconductor substrate of the logic chip.

2. A semiconductor device according to claim 1, wherein:
    said logic chip power supply circuit of said driver chip is a power supply circuit utilizing a band gap constant voltage.

3. A semiconductor device according to claim 1, wherein:
    the logic chip power supply is a voltage which is lower than an operating power supply for the driver chip.

4. A semiconductor device according to claim 1, wherein:
    the driver chip comprises an input/output cell circuit, and
    the logic chip power supply is a voltage which is lower than an operating power supply for the input/output cell circuit, the operating power supply being externally supplied.

5. A semiconductor device according to claim 1, wherein:
    said motor drive circuit, a part thereof using at least a bipolar device, comprising a vibration detection analog circuit and a vibration correction analog circuit for anti-shake control in equipment in which the semiconductor device is installed;
    said logic chip comprises digital circuits for creating a correction signal by obtaining a vibration amount on the basis of a vibration detection signal; and
    the created correction signal is supplied to said vibration correction analog circuit of said driver chip.

6. A semiconductor device according to claim 5, wherein:
    the equipment in which the semiconductor device is installed is image pickup equipment.

7. A semiconductor device according to claim 6, wherein:
    an optical lens of the image pickup equipment is controlled based on a control signal supplied from the vibration correction analog circuit.

8. A semiconductor device according to claim 6, wherein:
    an imaging device of the image pickup equipment is controlled based on a control signal supplied from the vibration correction analog circuit.

9. A semiconductor device according to claim 5, wherein:
    said logic chip power supply circuit of said driver chip is a power supply circuit utilizing a band gap constant voltage.

10. A multi-chip package semiconductor device comprising:
    a driver chip having analog circuits; and
    a logic chip having digital circuits;
    wherein the driver chip and the logic chip are provided within the same package; and
    wherein the driver chip comprises:
        a motor drive circuit for driving a motor in accordance with a signal obtained by the logic chip;
        a logic chip power supply circuit structured to create a logic chip power supply for said logic chip;
        and a logic chip power supply output terminal structured to output said logic chip power supply; and
    wherein the logic chip comprises a circuit operating by receiving power supply from said logic chip power supply circuit via a power supply input terminal;
    the motor drive circuit, the logic power supply circuit and the logic power supply output terminal are integrated on a same semiconductor substrate of the driver chip; and
    the digital circuits are integrated on a semiconductor substrate of the logic chip.

* * * * *